(12) United States Patent
Corisis (10) Patent No.: US 6,552,420 B1
(45) Date of Patent: Apr. 22, 2003

(54) REDUNDANT PINOUT CONFIGURATION FOR SIGNAL ENHANCEMENT IN IC PACKAGES

(75) Inventor: David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/342,478

(22) Filed: Jun. 29, 1999

Related U.S. Application Data

(62) Division of application No. 09/016,678, filed on Jan. 30, 1998.

(51) Int. Cl.⁷ .......................... H01L 23/495; H05K 7/20
(52) U.S. Cl. .................. 257/676; 257/692; 257/773; 257/786; 361/723; 361/772; 361/813
(58) Field of Search ................. 257/666, 669, 257/676, 692, 670, 678, 690, 693, 734, 773, 786; 361/723, 772, 773, 813; 438/106, 121, 123

(56) References Cited

U.S. PATENT DOCUMENTS

| 4,721,994 | A | 1/1988 | Mine et al. ............ 257/671 |
| 4,862,245 | A | 8/1989 | Pashby et al. ......... 257/660 |
| 4,867,715 | A | 9/1989 | Roth et al. ............ 439/876 |
| 4,916,506 | A | 4/1990 | Gagnon ................ 257/675 |
| 4,949,161 | A | 8/1990 | Allen et al. ........... 257/667 |
| 4,990,996 | A | 2/1991 | Kumar et al. ......... 257/786 |
| 5,147,815 | A | 9/1992 | Castro ................. 438/107 |
| 5,202,577 | A | 4/1993 | Ichigi et al. .......... 257/667 |
| 5,218,168 | A | 6/1993 | Mitchell et al. ....... 174/52.4 |
| 5,250,840 | A | 10/1993 | Oh et al. .............. 257/666 |
| 5,256,598 | A | 10/1993 | Farnworth et al. ..... 438/123 |
| 5,360,992 | A | 11/1994 | Lowrey et al. ........ 257/666 |
| 5,381,036 | A | 1/1995 | Bigler et al. .......... 257/666 |
| 5,429,992 | A | 7/1995 | Abott et al. .......... 438/123 |
| 5,497,030 | A | 3/1996 | Takeuchi .............. 257/676 |
| 5,508,565 | A | 4/1996 | Hatakeyama et al. ... 257/777 |
| 5,512,783 | A | 4/1996 | Wakefield et al. ..... 257/693 |
| 5,514,905 | A | 5/1996 | Sakuta et al. ......... 257/666 |
| 5,521,426 | A | 5/1996 | Russell ................ 257/666 |
| 5,523,617 | A | 6/1996 | Asanasavest .......... 257/666 |
| 5,530,292 | A | 6/1996 | Waki et al. ........... 257/724 |
| 5,563,443 | A | 10/1996 | Beng et al. ........... 257/666 |
| 5,585,668 | A | 12/1996 | Burns .................. 257/676 |
| 5,883,427 | A | 3/1999 | Arimoto ............... 257/690 |
| 6,114,878 | A | 8/2000 | Loughmiller et al. ... 326/101 |

FOREIGN PATENT DOCUMENTS

| EP | 579 464 A2 | 1/1994 |
| GB | 2 196 475 | 4/1988 |
| JP | 62-198132 | 9/1987 |
| JP | 3-78248 | 4/1991 |

*Primary Examiner*—Albert W. Paladini
*Assistant Examiner*—Alonzo Chambliss
(74) *Attorney, Agent, or Firm*—TraskBritt (57) ABSTRACT

A semiconductor device assembly package includes a semiconductor device having components thereon which are generic to a variety of applications by manipulation of the pinout configuration. The lead frame includes redundant leads for connection to the semiconductor device, as desired. The semiconductor device may include redundant wire bond pads, each redundant pair including one pad on a lateral edge and one pad on a non-lateral edge of the die. In applications requiring less than all of the available leads, the pinout configuration of the leadframe is adjusted to use the extra space from unused NC leads and missing pins for providing wider, shorter leads with reduced inductance, and wider paddle arms for reduced bending and breakage.

37 Claims, 4 Drawing Sheets

REDUNDANT PINOUT CONFIGURATION FOR SIGNAL ENHANCEMENT IN IC PACKAGES

CROSS REFERENCE TO RELATED APPLICATION

This application is a divisional of application Ser. No. 09/016,678, filed Jan. 30, 1998, pending.

BACKGROUND OF THE INVENTION

1. Field of the Invention

The present invention relates to semiconductor devices in general, and more particularly to redundant pinout package configurations for connecting the semiconductor device to a host electronic apparatus or substrate.

2. State of the Art

Modern packaged integrated circuits (IC) comprise one or more encapsulated semiconductor devices or chips within a protective "package" of plastic, ceramic, other moldable material, or hermetically sealed package. Typically, a large number of semiconductor devices are formed from a wafer made from a semiconductor material such as silicon, germanium or gallium arsenide. Microscopic circuits are formed on a surface of each semiconductor device by photolithographic techniques and are typically attached to a lead frame with conductive wires. More particularly, a plurality of leads of the lead frame is connected to bond pads on the semiconductor device or semiconductor dice, enabling the dice to be electrically interconnected to an external electrical apparatus.

On first generation IC devices, the semiconductor devices were relatively large, consuming most of the package space. The number of leads attached to the semiconductor device was also very limited. Thus, wide, short leads located adjacent the bond pads of the semiconductor device were used. The resulting wire bonds were short, and the inductance between the semiconductor device and the host apparatus was low.

In later generation IC devices, the semiconductor devices have become progressively smaller while the numbers of leads have typically increased. As a result, the lead frame leads of such semiconductor devices must, out of necessity, be much narrower and much longer, both of which increase the lead inductance and slow the speed of the device. In addition, the high density of wire connections typically makes wire bonding more difficult and results in an increase in bond failures. Furthermore, with very small semiconductor devices, the very fine wires connecting the semiconductor device to the leads of the lead frame may be very long, resulting in "wire sweep", sagging, short circuiting, and bond failure during encapsulation.

High inductance and reduced speed limit the usefulness of the packaged semiconductor device while shorting or destruction of the wire bonds will make the semiconductor device useless.

In the conventional package having a semiconductor device attached to a paddle, a reduction in device size and increase in bond pad density have also resulted in the die paddle support arms being longer, narrower, and weaker. Thus, problems in supporting the semiconductor device during attachment and wire bonding have increased.

The required spacing, width, and length of leads and wires have become a serious limitation in the further size reduction of semiconductor devices. While complex integrated circuits may be formed in very small semiconductor devices, connecting such a device or devices to a host apparatus while maintaining the semiconductor device characterization may be very difficult.

There have been various attempts at overcoming the high inductance or interactive conductance effects of small semiconductor devices. For example, in U.S. Pat. No. 5,521,426 to Russell, a leads-over-chip (LOC) semiconductor device with long, narrow leads is disclosed. In order to decrease the capacitance between the leads and the semiconductor device and increase lead strength, the leads are stamped or rolled to have a non-rectangular cross-section, such as a "U" configuration. Thus, the strength of the lead and its cross-sectional area are increased, resulting in less lead sag and reduced capacitative interaction. However, the cost of producing such leads is considerable, and the package thickness is increased. Furthermore, the method does not increase the size of wire bonding areas on the lead fingers of the lead frame, and the wire bonding operation is no easier.

While custom and semi-custom semiconductor devices are widely used in the electronics industry, a large part of the semiconductor device market is filled by semiconductor devices which may be used in a variety of applications, by using less than the maximum number of functions provided by the circuits thereon. Such a versatile semiconductor device may generally be made more cheaply than each of the custom semiconductor devices which it replaces. The current practice in the semiconductor industry is to produce semiconductor devices which have a generally wide versatility, i.e. they may be connected in different apparatus for performing a variety of electronic functions.

In a semiconductor device, more than one bond pad may be connected to a single exterior lead of a lead frame, or more than one exterior lead may be connected to a single bond pad. In many cases, however, each bond pad is connected to a single exterior lead of a lead frame.

The particular lead finger of a lead frame with which a bond pad is connected determines the "pinout" for that bond pad for the packaged semiconductor device. For example, in a dynamic random access memory (DRAM), if a bond pad on the semiconductor device which corresponds to Address 0 (AO) is bonded to the lead finger of a lead frame corresponding to Output Pin 5, then pin 5 on the package is used as AO. This hard wires the bond pad on the semiconductor device to the output of the lead frame, and remains that way for the life of the packaged semiconductor device.

U.S. Pat. No. 5,360,992 of Lowrey et al. proposes a two-part or three-part semiconductor package by which a semiconductor device circuit may be adapted to a variety of host apparatus following encapsulation of the device. Various "lead frames" of differing configurations are alternatively joined or attached to the encapsulated semiconductor device to provide the required pinout pattern. This method does nothing to reduce lead length (lengths may be increased) or increase the lead width.

In U.S. Pat. No. 5,256,598 of Farnworth et al., the concept of using a single "generic" lead frame for semiconductor devices of various sizes, cutting a device placement hole in the lead frame to match a particular device size, is illustrated. The number of lead fingers is fixed, and must be the maximum usable with the variety of semiconductor devices to be accommodated. As the semiconductor device size is decreased, the lead lengths must, out of necessity, be increased and their widths decreased, so the problem of high inductance is not solved.

It has been proposed to build functional redundancy into semiconductor devices, whereby extra circuit components are included to be used if one or more components are defective or inoperable. A larger semiconductor device must be used to accommodate the extra components as well as the extra circuitry for detecting functioning/non-functioning components and direct the selection of a functioning component. In addition, it may be necessary to provide means, such as a fuse, to internally disconnect unused circuitry. While such redundancy in electronic devices may be very useful at the design and development stages, it is of limited use in large scale production.

Whether the semiconductor device is configured to have a "generic" register for adaptation to many applications, or has functional redundancy, or both, in nearly all cases there are "No Connects" (NC) and/or missing pins identified in the registration. "No Connect" leads are typically found in a central portion of the lead frame, where bonding wires are usually short. Examples of such are the 20/26L SOJ (small outline J-bend) and 44/50L TSOP II (thin small outline package) devices.

SUMMARY OF THE INVENTION

The present invention is directed to a configuration for a semiconductor device where the package pinout registration has redundancy for critical signals to provide low inductance and high yield for all generations of the packaged semiconductor device.

The invention comprises the configuration of a semiconductor device wherein central lead locations normally identified in the register as "No Connects" (NC) or missing pin locations (MP) are used to provide redundancy for critical leads in the packaged semiconductor device. "No Connect" pin locations of the semiconductor device are reassigned to be those closer to the periphery of the lead frame, and cropped to allow the use of wider, shorter lead fingers for the other longer, narrower lead fingers of the lead frame. As a result of this redundant pinout scheme for the packaged semiconductor device, (a) wire bonding is faster and easier, (b) wire bond integrity and reliability are enhanced, (c) the shorter wires avoid problems with "wire sweep", (d) the lead frame is stronger and less subject to damage in handling, (e) signal integrity is increased, (f) the speed grade of the device is increased because of the reduced lead/wire inductance, and (g) a higher value product may be manufactured at lower cost.

BRIEF DESCRIPTION OF THE SEVERAL VIEWS OF THE DRAWINGS

The drawings presented herein illustrate the prior art and the advances of the present invention, though not necessarily drawn to scale, in which.

DETAILED DESCRIPTION OF THE INVENTION

Figure 1:
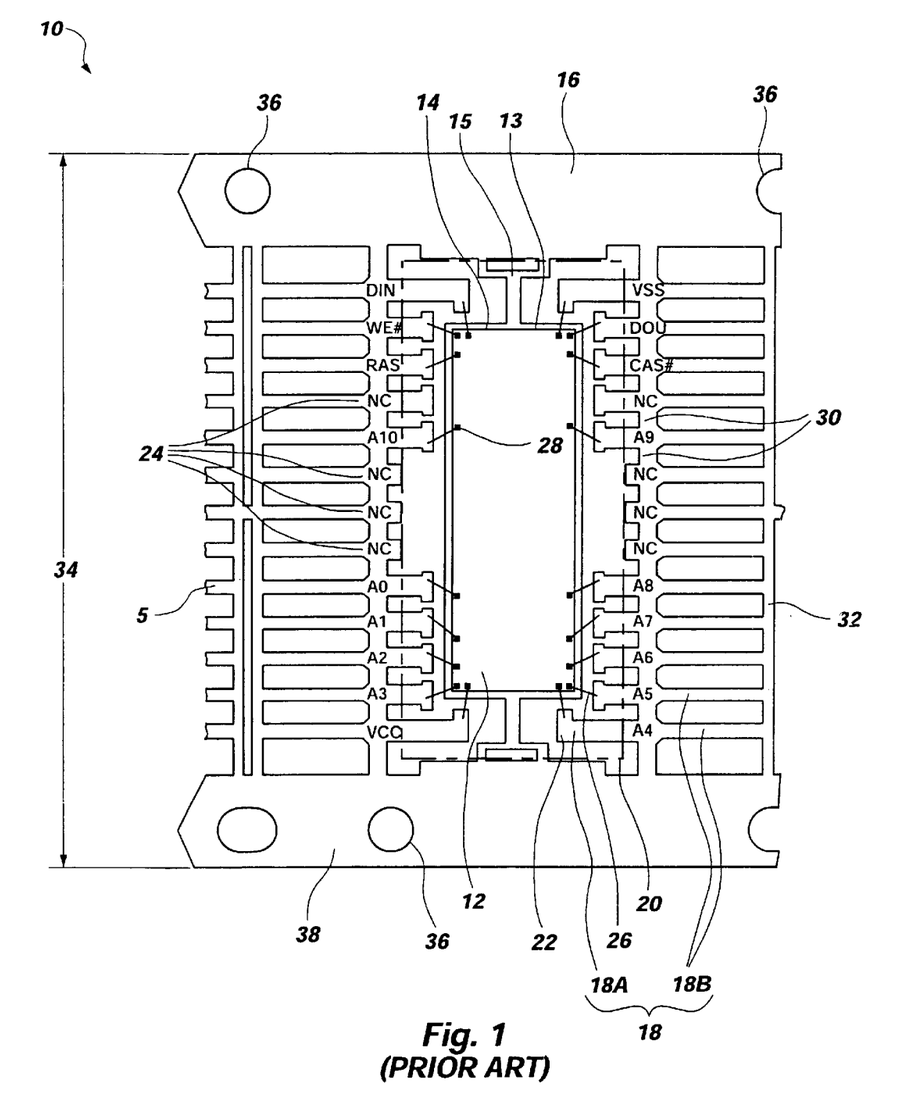
FIG. 1 is a plan view of a semiconductor device and attached lead frame of a first generation prior art semiconductor device.

A semiconductor device and lead frame configuration of an early generation prior art semiconductor device 10 is illustrated in drawing FIG. 1. As shown, the relatively large semiconductor die 12 is mounted on a paddle 14 of a lead frame 16 having a typical width 34 of less than one inch to several inches or more. A lead frame 16 typically has a recurring pattern of paddles 14 and leads 18 (including inner leads 18A and outer leads or pins 18B) for accommodating a plurality of semiconductor dice 12, and has index holes 36 in the outer, supportive lead frame rails 38 for sequential positioning of the lead frame in a wire bonding machine. The edges of the semiconductor die 12 facing the lead frame rails 38 will be known herein as lateral edges 13. The relatively short and wide lead fingers, i.e. inner leads 18A, are shown with enlarged wire bond areas 22. Conductive wires 26 connect the wire bond areas 22 of the inner leads 18A to the peripheral bond pads 28 on the active surface of the semiconductor die 12. Following wire bonding, the semiconductor die 12 and lead frame 16 are encapsulated, typically with a polymeric or ceramic material, to form a package 20. The dam bars 30 between the outer leads 18B are cut away, and the tie-bars 32 are trimmed to singulate each lead 18, enabling electrical connection of each bond pad 28 to an electronic apparatus, not shown, with minimum lead inductance. In addition, the paddle arms 15 are excised from the frame rails 38. The use of a large semiconductor die 12 with a relatively small number of peripheral bond pads 28 permits the use of relatively short, wide inner leads 18A having low inductance.

The leads 18 may be conventionally designated in the lead register as power supply voltage VCC, reference voltage VSS, data input DIN, data output DOUT, write enable signal WE, raw address strobe RAS, address signal A, column address strobe CAS, output enable OE, and other labels as required. The particular labels designated in the lead register may differ from manufacturer to manufacturer and differ depending upon the use to which the device is applied.

In order to lower their overall cost, semiconductor devices 10 are typically made to be used in a variety of applications, and in most applications, only some of the leads 18 are used. This is particularly true of the address signal A leads. Thus, while some leads 18 such as VCC, VSS, DIN, DOUT and WE may be used in all or nearly all applications, only some of the address signal (A) leads are typically used, leaving some leads as unused no-connect NC leads 24. The leads 18 most prone to causing induction noise, i.e. VCC, VSS, DIN, DOUT and WE, are conventionally located nearest the lead frame rails 38 to minimize inductive interaction with the signal A leads. Thus, in a particular application, the longest inner leads 18A (most prone to induction effects) are used while some of the shortest inner leads 18A near the center of the lead frame 16 (least prone to induction effects) become unused as NC leads 24.

An exemplary semiconductor device 40 of a later generation is shown in drawing FIG. 2 following a wire bonding step. For purposes of comparison, the lead frame width 65 is the same as the lead frame width 34 of drawing FIG. 1. The semiconductor die 42 is much smaller than the semiconductor die 12 of drawing FIG. 1, and is shown attached to a die paddle 44 of the lead frame 46. Peripheral bond pads 58 on the semiconductor die 42 are connected by bond wires 56 to wire bond areas 52 on the inner leads 48A of the lead frame 46. Due to the narrow spacing of inner leads 48A attached to the lateral edges 43 of the semiconductor die 42, the wire bond areas typically comprise unenlarged lead ends 64 for most of the inner leads 48A. Each lead 48 comprises an inner lead 48A and an outer lead 48B, the latter ultimately configured for attachment to a host electronic apparatus, not shown.

The leads 48 of the conductive lead frame 46 are attached to the side rails 68 by dam bars 60 and tie bars 62. The paddles 44 are attached to the side rails 68 by the paddle arms 45, as known in the art, and the side rails 68 include index holes 66.

The package 50 is formed following wire bonding, by encapsulation and subsequent excision of dam bars 60, tie bars 62 and paddle arms 45 from rails 68.

The much reduced size of the semiconductor die 42 results in much longer paddle arms 45. Thus, the propensity to bending and breakage of the paddle arms 45 is increased as the semiconductor die 42 becomes smaller. In some cases, it may even be necessary to reduce the width of the paddle arms 45 to accommodate the inner leads 48A, further exacerbating the problem.

The semiconductor device 40 is shown with eight No Connect (NC) leads 54, most located generally centrally between the rails 68 adjacent the non-lateral edges 51 of the semiconductor die 42. The leads 48 generally most subject to induction effects are those designated as VCC, VSS, DIN, DOUT, WE, RAS, and CAS. These leads, being generally closest to the rails 68 and connected to bond pads 58 along the lateral semiconductor device edges 51, are, out of necessity, increased in length and decreased in width from devices using larger semiconductor devices (such as shown in drawing FIG. 1). Thus, in the device of drawing FIG. 2, the propensity for generated induction is significantly increased, while at the same time, leads which may be both shorter and wider are unused, i.e. are NC leads 54. These difficulties are addressed by the redundant pinout configuration of the invention.

Figure 2:
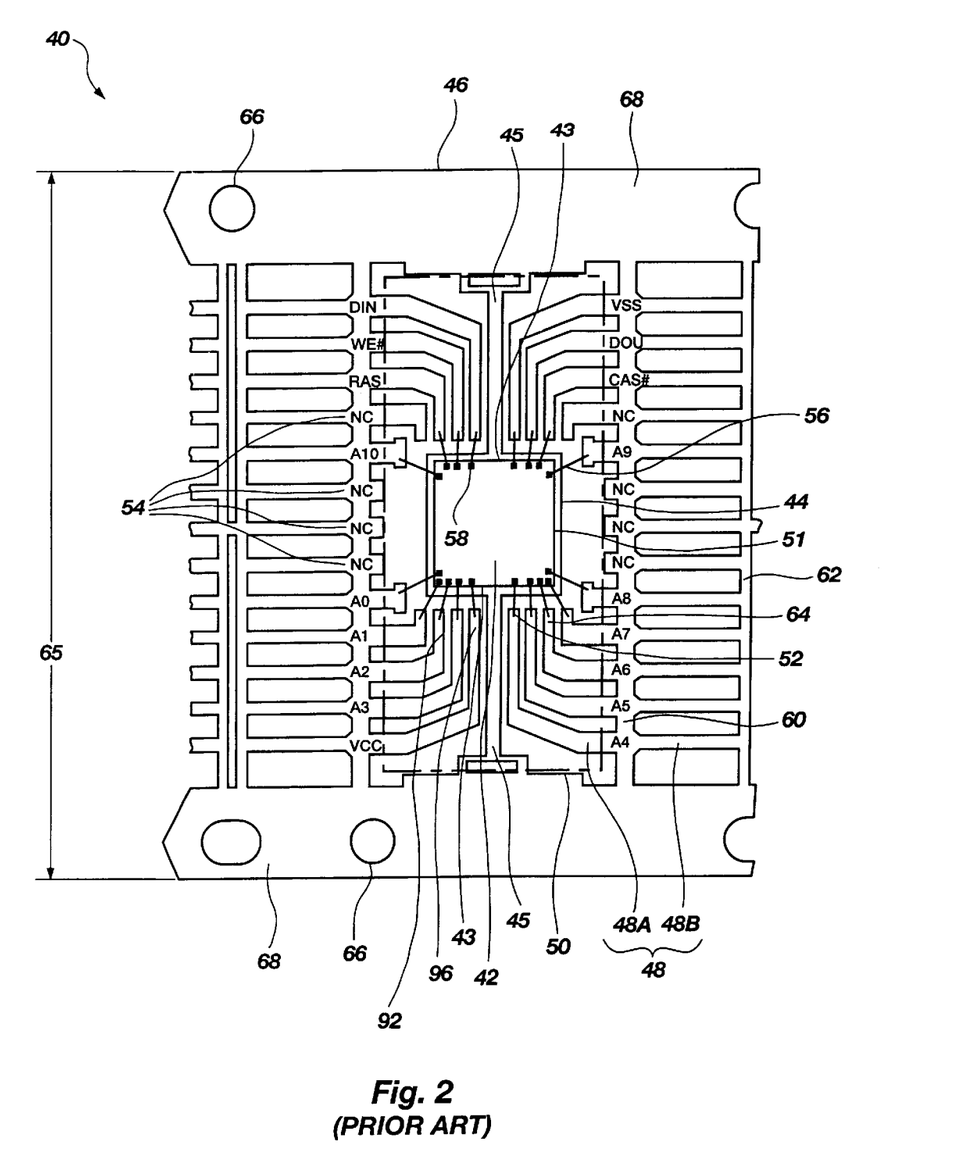
FIG. 2 is a plan view of a semiconductor device and attached lead frame of a later generation prior art semiconductor device.
Figure 3:
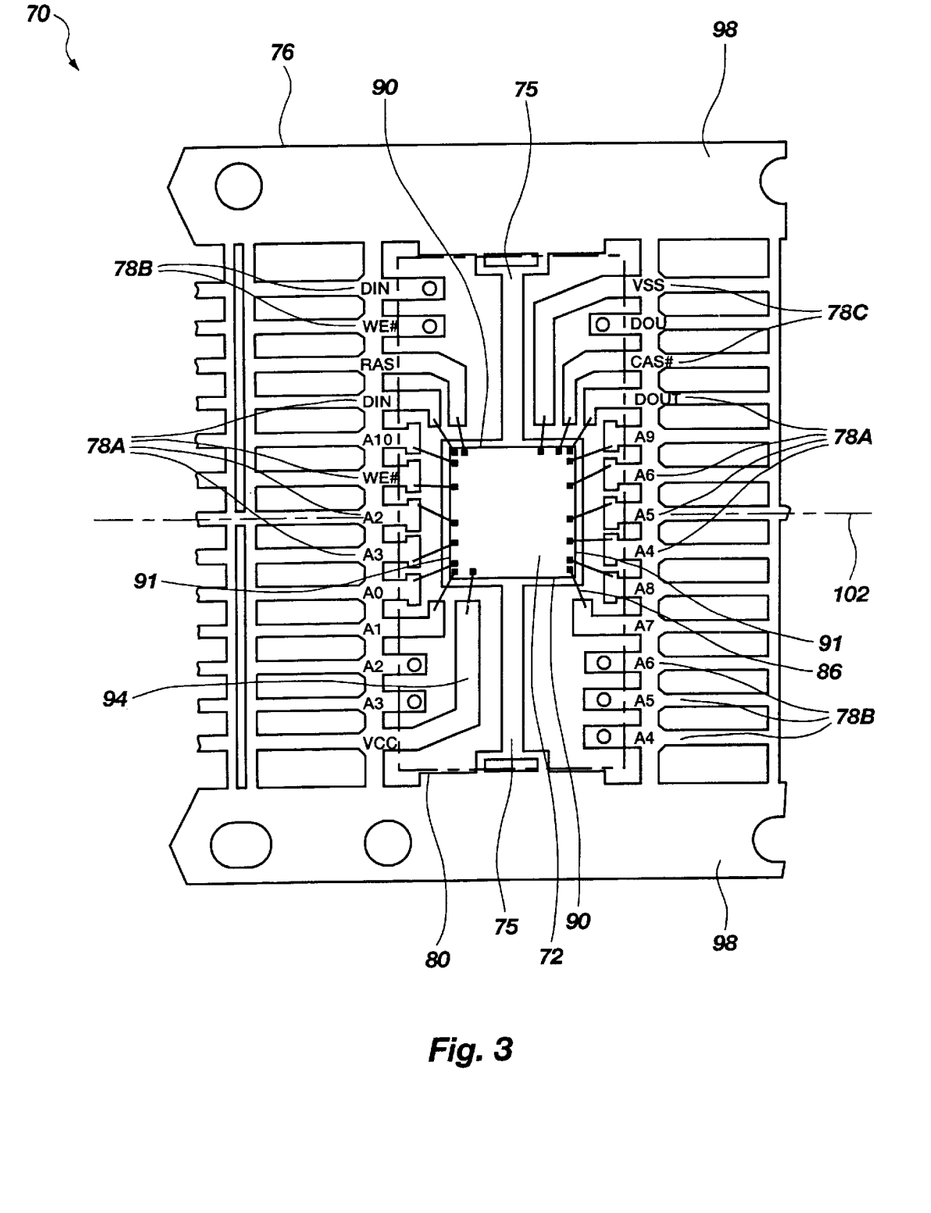
FIG. 3 is a plan view of a semiconductor device and attached lead frame of a semiconductor device of the present invention.
Figure 4:
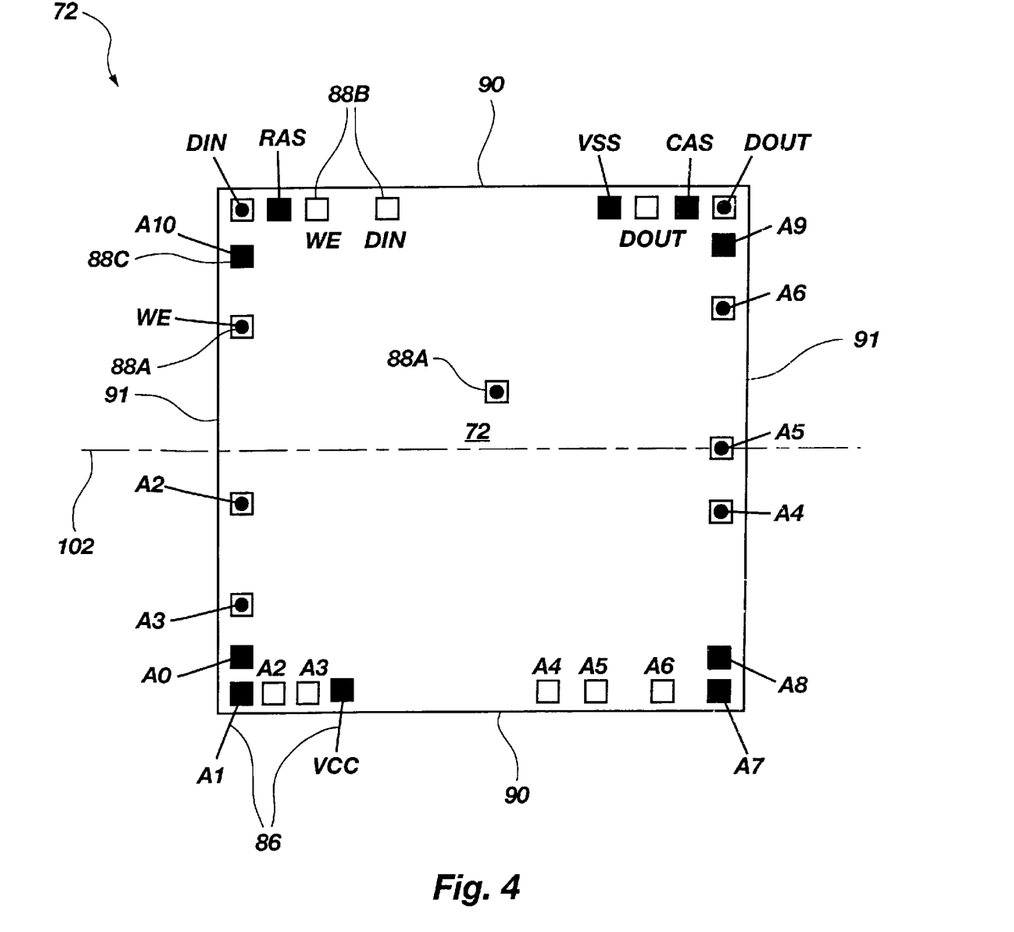
FIG. 4 is an enlarged plan view of the active surface of an exemplary semiconductor device having redundant bond pads enabling a pinout configuration of the invention which provides signal and construction enhancement.

Turning now to drawing FIGS. 3 and 4, a device 70 having the semiconductor die 72/leadframe 76 configuration of the invention is depicted as a modification of the device 40 of drawing FIG. 2. The semiconductor die 72, substantially square in shape, is shown as having a substantially similar outline as the semiconductor die 42 of drawing FIG. 2. The semiconductor die 72 has a "generic" circuit, logic, memory, or both, which may be useful in a variety of applications by using less than the entire circuit. The semiconductor device 70 may have redundant functions in its circuit, each with its own bond pad 88A. Alternatively, the semiconductor die 72 may have redundant bond pads 88A for an individual functional area of the semiconductor device circuit. The former type of redundancy typically requires a larger semiconductor die 72, is considerably more expensive to manufacture, and may require a provision for electrical disconnection of some unused internal conductors, e.g. by fuses installed within the die. On the other hand, bond pad redundancy typically requires only that additional small areas of the metallization semiconductor device circuit be exposed as bond pads by removal of an overlying passivation layer. Thus, bond pad redundancy rather than function redundancy in the semiconductor die 72 is preferred.

When compared with drawing FIG. 2, the semiconductor die 72 of drawing FIGS. 3 and 4 is shown with bond pads 88 as well as bond wires 86 connected thereto. Some of the bond pads 88 are redundant bond pads 88A connected to the same portion of the semiconductor device circuit. These redundant bond pads 88A are identified by enclosed circles and are redundant to bond pads which they have replaced. The latter are identified as pads 88B, and are now unused Non Connect (NC) bond pads (shown with blank centers). Bond pads 88C are shown as being unchanged from the semiconductor device 40 of drawing FIG. 2 to device 70 of drawing FIG. 3, and are connected by wires 86 to the corresponding inner leads 78 (drawing FIG. 3). These bond pads 88C are represented by filled-in squares.

In the example depicted in drawing FIGS. 3 and 4, redundant bond pads 88A are connected to semiconductor device circuit functions designated as DIN, DOUT, WE, A2, A3, A4, A5, and A6, previously identified. The inner leads 78A which are wire bonded to these redundant bond pads 88A are primarily in the central portion of the lead frame 76 between the two rails 98, i.e. along axis 102. Most or all of the redundant bond pads 88A are positioned along the non-lateral edges 91 of the semiconductor die 72, to be aligned with the corresponding inner leads 78A. Thus, the inner leads 78A for the DIN, WE, DOUT, and A2 through A6 functions are each shorter and/or wider than the comparable prior art leads 48 of drawing FIG. 2. Leads 48 which represented these functions in the prior design of drawing FIG. 2 are in drawing FIG. 3 excised as No Connect (NC) leads 78B. Additional room is thus created for the remaining leads 78C connected to bond pads 88C on the lateral edges 90 of the semiconductor die 72; these leads may be made wider to further reduce the inductance.

In the example shown, the minimum width 94 of the critical function leads in semiconductor device 70 is about 30–60 percent greater than the minimum width 92 of the comparable leads in semiconductor device 40.

Likewise, the maximum total length of the critical function leads in semiconductor device 70 is typically less of about 90 percent than the maximum length 96 of the comparable leads in semiconductor device 40.

Following the wire bonding operation, the lead frame 76 and attached die 72 are encapsulated and extraneous lead frame portions excised to form a semiconductor device package 80.

In an additional advantage of this invention, a portion of the additional space adjacent the lateral semiconductor device edges 90 may be used to widen the paddle arms 75 for increasing their strength and rigidity. This is evident by comparing the paddle arms 75 of FIG. 3 with paddle arms 45 of drawing FIG. 2. The wider paddle arms 75 provide a more sturdy platform for the die 72, resulting in less breakage from handling and fewer wire bond failures.

A semiconductor device 10, 40 may be installed in an electronic apparatus whereby all of the outer leads or pins are used. However, the more usual applications require connection to less than all of the available pins. In such cases, the redundant pinout configuration of the semiconductor package results in signal enhancement and manufacture with a lower reject rate.

It is evident that the present invention may be applied to semiconductor device configurations and packages other than those illustrated herein. For example, a lead over chip (LOC) package with outer leads, i.e. pins, on four sides may benefit from the invention. No Connect (NC) leads and missing pins are replaced by leads connected to redundant bond pads on the semiconductor device, and/or the otherwise wasted space is used to accommodate widened existing leads.

It is apparent to those skilled in the art that there is provided herein according to the invention a redundant pinout configuration for enhancing the operability and construction of a semiconductor device package. Although the semiconductor device has been described and illustrated with reference to a specific embodiment thereof, it is not intended that the invention be limited by the illustrated embodiment. Those skilled in the art will recognize that various modifications can be made without departing from the spirit and intent of the invention. For example, the invention is not limited to devices having peripheral bond pads nor to a specific number or types of leads, bond pads, dice, encapsulant, etc. Also, the invention may be used in semiconductor devices in which the device is attached to the leadframe by a non-conductive plastic layer, eliminating the paddle. Furthermore, the particular lead register may differ. Thus, it is intended that this invention encompass all such modifications and variations which fall within the scope of the appended claims.

What is claimed is:

1. A semiconductor device assembly, comprising:
   a semiconductor device having opposing lateral edges and opposing non-lateral edges, said semiconductor device having a plurality of bond pads thereon, said plurality of bond pads comprising at least one redundant bond pad located along said non-lateral edge of said semiconductor device, said at least one redundant bond pad being a duplicate of an unconnected bond pad located along one of said opposing lateral edges; and
   a lead frame having a plurality of leads thereon, at least two leads bonded to said plurality of bond pads, one lead of said at least two leads is bonded to said at least one redundant bond pad, and the other lead of said at least two leads is bonded to a non-redundant bond pad, said one lead bonded to said at least one redundant bond pad having a length shorter than the other lead of said at least two leads to provide low inductance in the semiconductor device assembly.

2. The semiconductor device assembly of claim 1, further comprising: a wire bond extending between the one lead having a length shorter than the other lead of said lead frame and said least one redundant bond pad of said semiconductor device.

3. The semiconductor device assembly of claim 1, further comprising: a package enclosing said semiconductor device and a portion of said lead frame.

4. The semiconductor device assembly of claim 1, wherein the one lead bonded to at least one said redundant bond pad includes critical connections for said semiconductor device.

5. A semiconductor device assembly, comprising:
   a semiconductor device having opposing lateral edges and opposing non-lateral edges, said semiconductor device having a plurality of bond pads thereon, said plurality of bond pads comprising at least one redundant bond pad located along said non-lateral edge of said semiconductor device, said at least one redundant bond pad being a duplicate of an unconnected bond pad located along one of said opposing lateral edges; and
   a lead frame having a plurality of leads thereon, at least two leads bonded to said plurality of bond pads, one lead of said at least two leads is bonded to said at least one redundant bond pad, and the other lead of said at least two leads is bonded to a non-redundant bond pad, said one lead bonded to said at least one redundant bond pad having a width thereof greater than a width of the other lead of said at least two leads to provide low inductance in the semiconductor device assembly.

6. The semiconductor device assembly of claim 5, further comprising:
   a wire bond extending between the one lead having the greater width and said at least one redundant bond pad of said semiconductor device.

7. The semiconductor device assembly of claim 5, further comprising: a package enclosing said semiconductor device and a portion of said lead frame.

8. The semiconductor device assembly of claim 5, wherein at least one bond pad of the semiconductor device includes connections for critical electrical signals of the semiconductor device.

9. The semiconductor device assembly of claim 5, wherein at least one bond pad of the semiconductor device includes a desired bond pad of the semiconductor device.

10. The semiconductor device assembly of claim 5, wherein the semiconductor device includes any desired bond pads located substantially along the opposing non-lateral edges thereof connected to the one lead having the greater width.

11. A semiconductor device assembly, comprising:
    a semiconductor device having opposing lateral edges and opposing non-lateral edges, said semiconductor device having a plurality of bond pads thereon, at least two bond pads of the plurality of bond pads being redundant bond pads, said redundant bond pads located along said non-lateral edges of said semiconductor device, said redundant bond pads being duplicates of unconnected bond pads located along one of said opposing lateral edges; and
    a lead frame having a plurality of leads thereon, at least two leads bonded to said plurality of bond pads, one lead of said at least two leads is bonded to one of said at least two redundant bond pads, and the other lead of said at least two leads is bonded to a non-redundant bond pad, said one lead bonded to said one of said at least two redundant bond pads having a length shorter than the other lead of said at least two leads to provide low inductance in the semiconductor device assembly.

12. The semiconductor device assembly of claim 11, further comprising:
    a wire bond extending between the one lead having the length shorter than the other lead of said at least two leads and one of the at least two redundant bond pads of the plurality of bond pads of said semiconductor device.

13. The semiconductor device assembly of claim 11, further comprising: a package enclosing said semiconductor device and a portion of said lead frame.

14. The semiconductor device assembly of claim 11, wherein the at least two redundant bond pads of the semiconductor device include connections for critical electrical signals of the semiconductor device.

15. The semiconductor device assembly of claim 11, wherein the at least two redundant bond pads of the semiconductor device include any desired bond pads of the semiconductor device.

16. The semiconductor device assembly of claim 11, wherein the semiconductor device includes any desired bond pads located along the opposing lateral edges thereof.

17. A semiconductor device assembly, comprising:
    a semiconductor device having a plurality of components, said semiconductor device having opposing lateral edges and opposing non-lateral edges, said semiconductor device having a plurality of conductive bond pads connected to said plurality of components, a portion of said plurality of bond pads provided in duplicate whereby said duplicate bond pads comprise redundant bond pads selectable for wire bonding, said redundant bond pads are located along said opposing non-lateral edges of the semiconductor device, said redundant bond pads being duplicates of unconnected bond pads located along one of said opposing lateral edges;
    a lead frame formed having a plurality of leads thereon, at least two-leads of said plurality of leads, one lead of said at least two leads for connecting to at least one said redundant bond pad of the plurality of bond pads of the semiconductor device, and the other lead of said at least two leads for connecting to a non-redundant bond pad, said one lead of said at least two leads of said plurality of leads being shorter than the other lead of said at least two leads to provide low inductance in the semiconductor device assembly;

at least one wire bond extending between said shorter lead of said at least two leads of said plurality of leads of said lead frame and at least one said redundant bond pad of said semiconductor device; and a package enclosing said semiconductor device and a portion of said lead frame.

18. The semiconductor device assembly of claim 17, wherein the redundant bond pads of the semiconductor device include connections for critical electrical signals of the semiconductor device.

19. The semiconductor device assembly of claim 17, wherein the redundant bond pads of the semiconductor device include any desired bond pads of the semiconductor device.

20. The semiconductor device assembly of claim 17, wherein the semiconductor device includes any desired bond pads located along the opposing lateral edges thereof.

21. A semiconductor device assembly, comprising:

a semiconductor device having a plurality of components, said semiconductor device having opposing lateral edges and opposing non-lateral edges, said semiconductor device having a plurality of conductive bond pads connected to said plurality of components, a portion of said plurality of bond pads provided in duplicate whereby said duplicate bond pads comprise redundant bond pads selectable for wire bonding, said redundant bond pads located along said opposing non-lateral edges of the semiconductor device, said redundant bond pads being duplicates of unconnected bond pads located along one of said opposing lateral edges; and a lead frame formed having a plurality of leads thereon, a first portion of the plurality of leads terminating adjacent the opposing lateral edges of the semiconductor device and having a first length and a second portion of the plurality of leads terminating adjacent the opposing non-lateral edges of the semiconductor device and having a second length longer than the first length, a width of the first portion of the plurality of leads being at least substantially the same as a width of the second portion of the plurality of leads to provide low inductance in the semiconductor device assembly.

22. The semiconductor device assembly of claim 21, wherein the width of the first portion of the plurality of leads of the lead frame is substantially greater than the width of the second portion of the plurality of leads.

23. The semiconductor device assembly of claim 21, wherein the second portion of the plurality of leads includes at least one lead having a substantially non-linear shaped configuration.

24. The semiconductor device assembly of claim 21, wherein the first portion of the plurality of leads includes a plurality of leads having a substantially linear shaped configuration.

25. The semiconductor device assembly of claim 21, wherein the second portion of the plurality of leads is configured to be substantially straight to terminate adjacent the non-lateral edges of the semiconductor device.

26. The semiconductor device assembly of claim 21, wherein the first portion of the plurality of leads includes at least one lead having a substantially non-linear shaped configuration.

27. The semiconductor device assembly of claim 21, wherein the first portion of the plurality of leads includes a plurality of leads having a substantially non-linear shaped configuration.

28. The semiconductor device assembly of claim 21, wherein said plurality of bond pads is arrayed along at least two edges of said semiconductor device.

29. The semiconductor device assembly of claim 21, wherein a minimum width of at least one lead of the first portion of the plurality of leads is at least about 30 percent wider than a minimum width of at least one lead of the second portion of the plurality of leads.

30. The semiconductor device assembly of claim 21, wherein the redundant bond pads of the semiconductor device are located substantially along the non-lateral edges of the semiconductor device.

31. The semiconductor device assembly of claim 21, wherein the redundant bond pads of the semiconductor device include any desired bond pads of the semiconductor device.

32. The semiconductor device assembly of claim 21, wherein the semiconductor device includes any desired bond pads located along the opposing lateral edges thereof.

33. The semiconductor device assembly of claim 32, wherein the first portion of the plurality of leads includes leads connected to the bond pads of the semiconductor device located along the opposing lateral edges thereof.

34. The semiconductor device assembly of claim 32, wherein at least one lead of the first portion of the plurality of leads and at least one lead of the second portion of the plurality of leads are connected to a bond pad of the semiconductor device.

35. The semiconductor device assembly of claim 34, wherein the at least one lead of the first portion of the plurality of leads and the at least one lead of the second portion of the plurality of leads are connected to a bond pad of the semiconductor device using wire bonds.

36. The semiconductor device assembly of claim 21, wherein said redundant bond pads include at least one pad on a periphery of said opposing lateral edges and at least one pad on a periphery of said opposing non-lateral edges of said semiconductor device.

37. The semiconductor device assembly of claim 21, wherein said opposing lateral edges of said semiconductor device and said opposing non-lateral edges of said semiconductor device are substantially the same length.

* * * * *

UNITED STATES PATENT AND TRADEMARK OFFICE
CERTIFICATE OF CORRECTION

PATENT NO. : 6,552,420 B1
DATED : April 22, 2003
INVENTOR(S) : David J. Corisis

It is certified that error appears in the above-identified patent and that said Letters Patent is hereby corrected as shown below:

Column 6,
Line 7, after "A5," and before "and" insert -- A0, A1, A7, A8, A10, --

Column 7,
Line 40, change "at least one said" to -- said at least one --

Signed and Sealed this

Twenty-third Day of November, 2004

JON W. DUDAS
*Director of the United States Patent and Trademark Office*